(12) United States Patent
Gong et al.

(10) Patent No.: US 8,329,509 B2
(45) Date of Patent: Dec. 11, 2012

(54) PACKAGING PROCESS TO CREATE WETTABLE LEAD FLANK DURING BOARD ASSEMBLY

(75) Inventors: Zhiwei Gong, Chandler, AZ (US); Nageswara Rao Bonda, Chandler, AZ (US); Wei Gao, Tianjin (CN); Jinsheng Wang, Tianjin (CN); Dehong Ye, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 403 days.

(21) Appl. No.: 12/752,717

(22) Filed: Apr. 1, 2010

(65) Prior Publication Data

US 2011/0244629 A1 Oct. 6, 2011

(51) Int. Cl.
*H01L 21/50* (2006.01)

(52) U.S. Cl. ........ 438/112; 438/113; 438/114; 438/124; 257/E21.499

(58) Field of Classification Search ................ 438/112, 438/111, 113, 114, 123, 124; 257/E21.499
See application file for complete search history.

(56) References Cited

U.S. PATENT DOCUMENTS

| | | | |
|---|---|---|---|
| 6,238,952 B1 | 5/2001 | Lin | |
| 6,261,864 B1 | 7/2001 | Jung et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,495,909 B2 | 12/2002 | Jung et al. | |
| 6,528,893 B2 | 3/2003 | Jung et al. | |
| 6,608,366 B1 | 8/2003 | Fogelson et al. | |
| 6,700,188 B2 | 3/2004 | Lin | |
| 6,861,295 B2 | 3/2005 | Jung et al. | |
| 7,023,074 B2 | 4/2006 | Li et al. | |
| 7,033,866 B2 | 4/2006 | Chow et al. | |
| 7,105,383 B2 | 9/2006 | Vo et al. | |
| 7,348,269 B2 | 3/2008 | Tanaka et al. | |
| 7,382,045 B2 | 6/2008 | Osako et al. | |
| 7,397,112 B2 | 7/2008 | Sato et al. | |
| 7,402,459 B2 | 7/2008 | Xiaochun et al. | |
| 7,405,104 B2 | 7/2008 | Minamio et al. | |
| 7,405,106 B2 | 7/2008 | Maloney et al. | |

(Continued)

FOREIGN PATENT DOCUMENTS

JP 2000294719 A 10/2000

(Continued)

OTHER PUBLICATIONS

K.J. Hess et al, U.S. Appl. No. 12/617,477, filed Nov. 12, 2009, entitled Semiconductor Device Package.

(Continued)

*Primary Examiner* — Michael Trinh
(74) *Attorney, Agent, or Firm* — Hamilton & Terrile, LLP; Michael Rocco Cannatti (57) ABSTRACT

A method and apparatus are described for fabricating a low-pin-count chip package (701) including a die pad (706) for receiving an integrated circuit device and a plurality of connection leads (702) having recessed lead ends (704) at the outer peripheral region of each contact lead. After forming the package body (202) over the integrated circuit device, unplated portions (104) of the exposed bottom surface of the selectively plated lead frame are partially etched to form recessed lead ends (302) at the outer peripheral region of each contact lead, and the recessed lead ends are subsequently re-plated (402) to provide wettable recessed lead ends at the outer peripheral region of each contact lead.

20 Claims, 4 Drawing Sheets

U.S. PATENT DOCUMENTS

| | | | |
|---|---|---|---|
| 7,405,945 | B2 | 7/2008 | Miura |
| 7,413,934 | B2 | 8/2008 | Tellkamp |
| 7,423,337 | B1 | 9/2008 | Patwardhan et al. |
| 7,456,049 | B2 | 11/2008 | Miyata |
| 7,458,054 | B2 | 11/2008 | Hara |
| 7,462,870 | B2 | 12/2008 | Nakashima |
| 7,608,930 | B2 * | 10/2009 | Kasuya et al. ............... 257/779 |
| 8,084,299 | B2 * | 12/2011 | Tan et al. ..................... 438/111 |
| 2005/0029638 | A1 | 2/2005 | Ahn et al. |
| 2006/0035414 | A1 * | 2/2006 | Park et al. .................... 438/124 |
| 2007/0126092 | A1 * | 6/2007 | San Antonio et al. ........ 257/674 |
| 2008/0258278 | A1 * | 10/2008 | Ramos et al. ................. 257/676 |

FOREIGN PATENT DOCUMENTS

| | | | |
|---|---|---|---|
| JP | 2007-214185 | * | 8/2003 |
| JP | 2007-214185 | | 8/2007 |
| WO | 2009/125250 A1 | | 10/2009 |
| WO | WO-2009-125250 | * | 10/2009 |

OTHER PUBLICATIONS

PCT/US2011/027527 International Search Report and Written Opinion mailed Nov. 14, 2011.

* cited by examiner

PACKAGING PROCESS TO CREATE WETTABLE LEAD FLANK DURING BOARD ASSEMBLY

BACKGROUND OF THE INVENTION

1. Field of the Invention

The present invention is directed in general to the field of semiconductor chip packages. In one aspect, the present invention relates to a lead frame design and packaging scheme for producing lead frame packages.

2. Description of the Related Art

Quad Flat No-Lead (QFN) and Power Quad Flat No-leads (PQFN) packages are used to encapsulate one or more integrated circuit die while retaining exposed pads which physically and electrically connect integrated circuit die to printed circuit boards (PCB). These QFN and PQFN packages are surface-mount technologies that connect integrated circuit dies to the surfaces of PCBs without through-holes using perimeter lead pads on the bottom of the package to provide electrical contact to the PCB. Conventional QFN/PQFN packaging approaches have performed injection molding after mounting the integrated circuit die on the lead frame having selectively recessed leads and before singulating individual QFN/PQFN packages. With these approaches, mold compound material is formed in the recesses, thereby impairing visibility of the solder fillets and reducing the available solderable area which decreases the overall solder joint strength and reliability between the QFN/PQFN package and PCB/motherboard.

Accordingly, a need exists for an improved integrated circuit chip package and manufacture method that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A method and apparatus are described for fabricating integrated circuit die in lead frame packages (e.g., QFN or PQFN packages) with exposed pad and wettable leads. In selected embodiments, the packaging process begins with a lead frame strip that is selectively plated (e.g., a copper lead frame strip is selectively plated with nickel palladium in the die flag and lead areas). After affixing and wire-bonding the integrated circuit die to the die flags, an encapsulation molding process is then applied to the selectively plated lead frame strip. Subsequently, a selective etch process is applied to partially etch the unplated regions (e.g., copper) on exposed backside surfaces of the lead frame strip to form recesses in the intended singulation areas. Prior to singulation, the recessed areas are then re-plated (e.g., with nickel palladium or any other appropriate wettable material) to a predetermined thickness so that recesses remain in the lead areas, thereby forming wettable lead flanks. By singulating the individual packaged devices with a saw that is applied along the singulation areas, each packaged device is formed with recessed wettable lead flanks that provide increased solderable area, thereby increasing the overall solder joint strength and reliability while maintaining the quality and efficiency of sawn lead frame packaging processes. The recessed wettable lead flanks also allow the solder fillets to be visually inspected after the packaged device is soldered to the PCB.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a lead frame strip and associated packaging without including every device feature or geometry in order to avoid limiting or obscuring the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted packaging structures with recessed wettable lead flanks. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Figure 1:
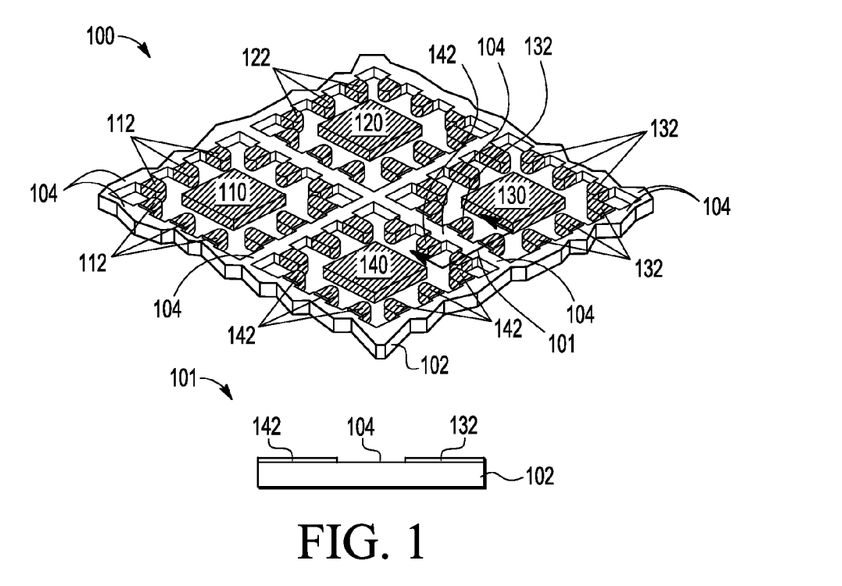
FIG. 1 illustrates a perspective and partial side view of a selectively plated lead frame strip defining multiple lead frames having exposed copper areas in the singulation areas.

Referring now to FIG. 1, there is shown a perspective and partial side view of a selectively plated lead frame strip 100 defining multiple lead frames having exposed copper areas 104 in the intended singulation areas. As shown, the selectively plated lead frame strip 100 may be produced by stamping or etching a portion of a metal strip 102 (e.g., copper or copper alloy) with a predetermined pattern of lead frame features (e.g., die attach flags, interior electrical contacts, exterior electrical contacts, etc.). Each depicted lead frame includes a one or more interior die attach flags (e.g., 140) and a plurality of exterior electrical contact leads (e.g., 142) that are connected together by a dam bar (not shown). As will be appreciated, the dam bar is later removed (i.e., trimmed) from lead frame strip during device processing to physically separate and electrically isolate the die attach flags and exterior electrical contact leads. As will be appreciated, each die attach flag (e.g., 140) is configured to support an integrated circuit (IC) die or device, such as a processor, analog device, sensor, application specific integrated circuit (ASIC), etc. Though not shown, an IC die may be mounted on the back or underside of the die attach flag (from the perspective of FIG. 1), and includes a surface on which bond pads are formed. Conventional die bonding may be used to secure the IC die to the die attach flag 140 with a suitable bonding material (e.g., epoxy, glass, gold preform, solder paste, etc.), and the IC die may then be wire bonded to a selected group of interior electrical contact leads 142 with, for example, segments of gold wire.

The exposed die flag (e.g., 140) and exterior electrical contact leads (e.g., 132, 142) of the copper lead frame 102 may be plated on at least the exterior surface with a material that is wettable to solder and electrically conductive (e.g. with NiPd or NiPdAu). In addition or in the alternative, the function of the plating material is to be a masking or barrier layer to protect the underlying copper lead frame area from etching by providing a layer that is inert to the subsequent etching chemistry and that is compatible to the plating process after etching. The selective plating leaves exposed the copper surface areas 104 in the intended singulation areas between the plated contact leads 142, 132, as shown with the partial side view 101 of the intended singulation area. When the die attach flags are located in substantially the same plane as the remainder of the lead frame, the die flags and contact leads remain exposed even after the remainder of the lead frame is encapsulated. However, the die attach flags may be recessed with respect to the remainder of the lead frame so that only the contact leads remain exposed even after the remainder of the lead frame is encapsulated.

Figure 2:
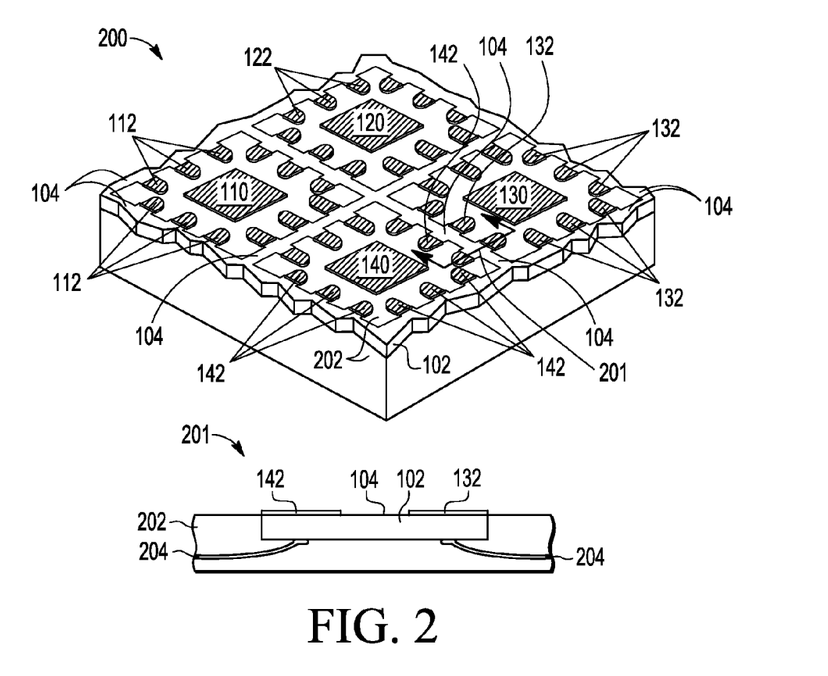
FIG. 2 illustrates a perspective and partial side view of the selectively plated lead frame strip shown in FIG. 1 after being encapsulated with a molding compound.

Turning now to FIG. 2, there is illustrated processing of the lead frame strip 200 subsequent to FIG. 1 with a perspective and partial side view of the selectively plated lead frame strip after the IC die (not shown) is encapsulated with a molding compound 202. In particular, after the IC die has been die bonded to flags (e.g., 140) and wire bonded to connect wire conductors 204 to selected ones of electrical contact leads (e.g., 142), the lead frame strip 200, IC die, and wirebonds are encapsulated with a composite material (e.g., plastic) to create a molded body 202 which may be formed by transfer molding, compression molding, injection molding, or otherwise forming an encapsulant to seal and protect the IC die from moisture, contamination, corrosion, and mechanical shock. The mold encapsulant may be a silica-filled resin, a ceramic, a halide-free material, or some other protective encapsulant layer. The mold encapsulant is typically formed by molding thermosetting materials in a process where a plastic is softened by heat and pressure in a transfer chamber, then forced at high pressure through suitable sprues, runners, and gates into a closed mold for final curing. The mold encapsulant may also be formed by using a liquid which is then heated to form a solid by curing in a UV or ambient atmosphere, or by using a solid that is heated to form a liquid and then cooled to form a solid mold.

As formed, the top of the IC die and connecting wires will be covered with the molding compound 202 and thereby protected from the environment. In addition, the formation of the molding compound 202 leaves the die flags (110, 120, 130, 140), exterior electrical contact leads (112, 122, 132, 142), and exposed copper surface areas 104 exposed on the topside surface (from the perspective of FIG. 2), as shown with the partial side view 201 of the intended singulation area where the electrical contact leads 132, 142 and exposed copper surface areas 104 are not covered by the molding compound 202. While the molding compound 202 is depicted as being formed to be flush with the exposed die flag 140 and contact leads 142 in keeping with a QFN (Quad Flat No leads) or PQFN (Power Quad Flat No-leads) packaging scheme, other substrate packaging schemes could also be used which leave exposed the electrical contact leads and exposed copper surface areas in the intended singulation area.

In situations where the unplated copper is not as thick as the plated copper, there is a small gap formed between the plating layers into which the encapsulant material could flow during injection molding if not controlled. However, it will be appreciated that the thickness gap is minimal (e.g., only 1-2 microns) since the NiPdAu or NiPd plating coating is very thin. Because the step height difference from the gap is negligible, an adhesive layer of tape that is attached to the leadframe before and during molding will prevent the compound from flowing to the unplated regions. Alternatively, the lead frame array may be formed so that there is no thickness gap between the plated and unplated copper.

Figure 3:
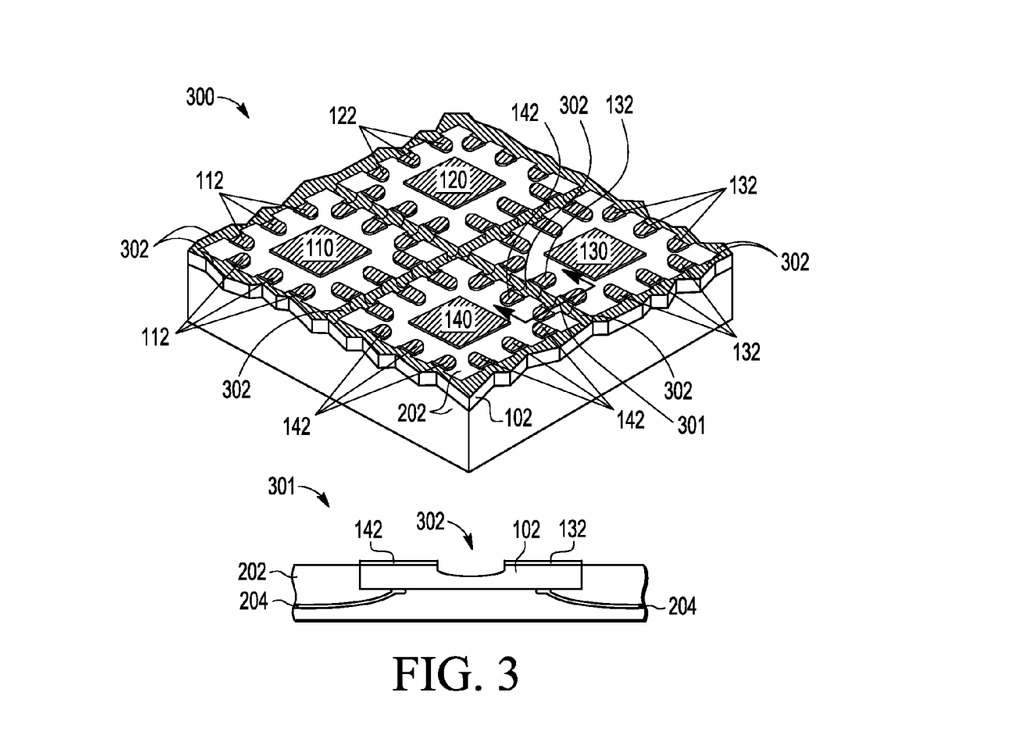
FIG. 3 illustrates a perspective and partial side view of the encapsulated lead frame shown in FIG. 2 after partially etching the exposed copper areas.

After the encapsulation molding process is applied, a selective etch process is applied to partially etch the unplated regions (e.g., copper) on exposed backside surfaces of the lead frame strip to form recesses in the intended singulation areas. In selected embodiments, the partial etch process may be implemented by applying a copper etch chemistry, such as a persulfate salt (e.g. ammonium persulfate or sodium persulfate), as an immersion or spray process that is selective to the first plating coating to form a recess in the contact lead end with an etch depth of approximately 50 microns, though other etch chemistries and depths may be used. This is shown in FIG. 3 which illustrates a perspective and partial side view of the encapsulated lead frame shown 400 in FIG. 2 after the exposed copper areas 104 are partially etched to form recesses 302 in the intended singulation areas. The recesses 302 may be formed with any desired selective etch process which can be controlled to remove a predetermined thickness of the exposed copper without removing the material from the plated leads. For example, the recesses 302 may be formed by chemical etching or any suitable half-etch technique. Upon conclusion, the partial etch process forms recesses 302 in the intended singulation areas between the plated contact leads 142, 132, without removing the electrical contact leads 132, 142, as shown with the partial side view 301 of the intended singulation area.

Figure 4:
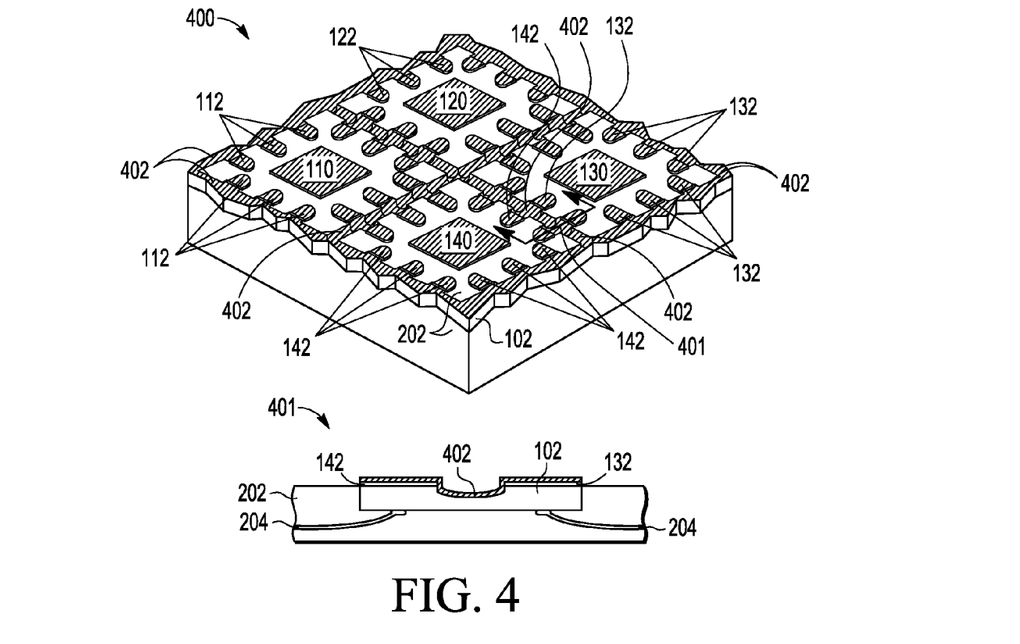
FIG. 4 illustrates a perspective and partial side view of the partially recessed and encapsulated lead frame strip shown in FIG. 3 after replating the partially recessed areas.

After forming the recesses 302 in the copper lead frame 102, the recessed areas are then re-plated to a predetermined thickness so that the exposed copper is covered while recesses remain in the lead areas. The result of the re-plating is illustrated in FIG. 4 with a perspective and partial side view of the partially recessed and encapsulated lead frame strip 400 after re-plating the partially recessed areas 302 and contact leads 142, 132 with re-plate layers 402. At this stage, the re-plate layers 402 may be formed with any desired lead-free solder plating material, including but not limited to a high Tin material (e.g., Sn—Cu, Sn—Bi or Sn—Ag), a nickel palladium-based material (e.g., NiPd or NiPdAu), or any other appropriate wettable material. A typical composition of a high Tin re-plating material alloy is 95-99.5% Tin with the balance formed with other metal(s), and is compatible with the integrated circuit back end processing. The plating or deposition process is controlled to limit the thickness of the re-plate layer 402 so that recesses remain in the singulation areas, thereby forming wettable lead flanks or ends that are plated and configured in a manner to allow solder to reflow up the recesses toward the lead ends, as shown with the partial side view 401 of the intended singulation area.

Figure 5:
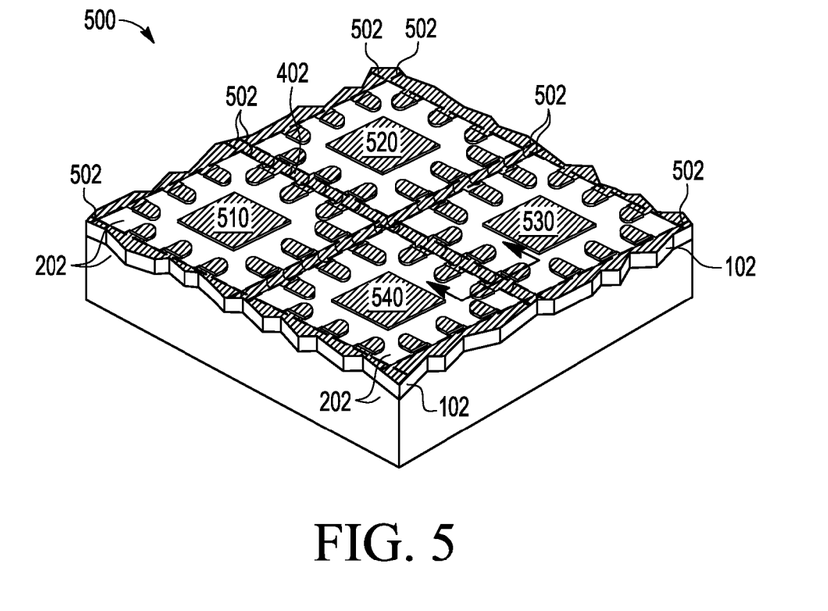
FIG. 5 illustrates a perspective view of the saw cut lines to be used in singulating the lead frame strip shown in FIG. 4.

Subsequent to forming re-plated recessed areas 402 in the singulation areas, individual packaged devices are singulated with a saw that is applied to the lead frame strip 500 along the saw cut lines 502 shown with in perspective view in FIG. 5. As illustrated, saw cut lines 502 are positioned along the singulation areas for separating individual packaged die by cutting down through the re-plated recessed areas 402 and molding compound 202, leaving a portion of the re-plated recessed areas 402 at the peripheral end of each of the electrical contact leads 112, 122, 132, 142. In particular, the positioning and alignment of the cut lines 502 should be controlled so there is no intersection with any un-recessed portions of the exterior electrical contact leads (e.g., 112, 122, 132, 142) so that a portion of the recessed area remains after the saw cut is performed.

Figure 6:
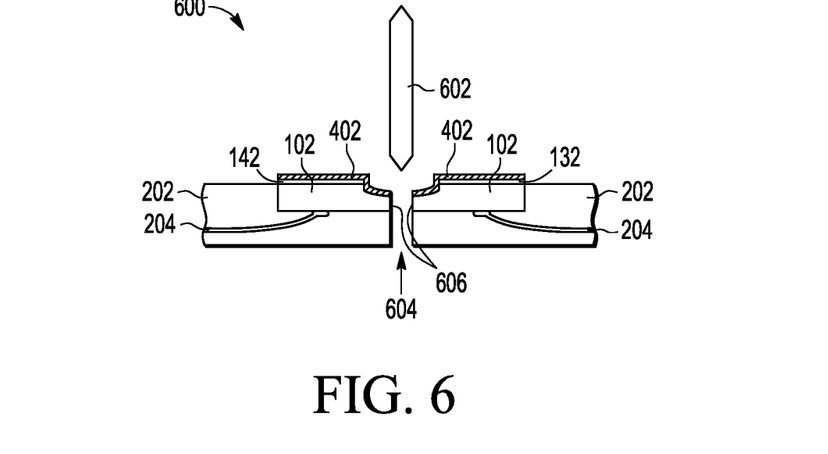
FIG. 6 illustrates a partial side view of the partially recessed and encapsulated lead frame strip after singulation along the saw cut lines shown in FIG. 5.

The result of applying the saw along the cut lines 502 is depicted in FIG. 6 which illustrates a partial side view of the partially recessed and encapsulated lead frame strip 600 after singulation. By cutting into the package body 202 through the re-plating layer 402 and copper lead frame 102, separation gaps 604 are formed which separate the chip modules 510, 520, 530, 540. Each chip module created by the cutting action will have a sidewall surface which includes molding compound portion 202, an exposed metal lead frame portion 606, and a re-plate layer portion 402. The separation gaps 604 are shown as having vertical sidewalls, but it will be appreciated that the separation gaps 604 may instead have angled sidewalls, depending on the device or technique used to singulate the chip modules. Thus, the cut may be made with a saw 602 having a cutting blade, a laser, or any other instrument that can segregate or singulate the chip modules 510, 520, 530, 540. While the cutting instrument may be positioned to provide a depth cut that is greater than the combined height of the package body 202, shallower cut depths also be used. For example, by controlling the cutting action so that the separation gaps 604 terminate in an underlying removable attachment device attached to the bottom surface of the molding compound (not shown), the position of the individual chip modules 510, 520, 530, 540 is maintained by virtue of the adhesive function provided by the removable attachment device, which helps facilitate subsequent handling or processing of the individual chip modules.

Figure 7:
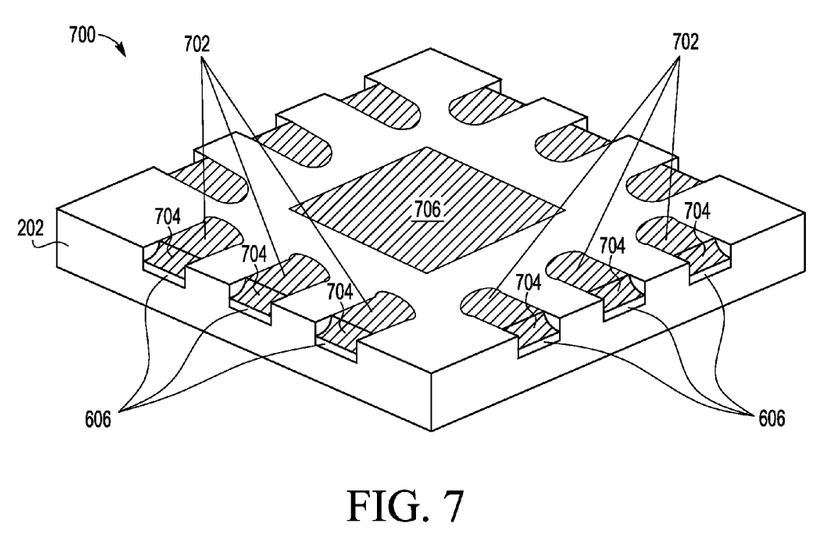
FIG. 7 illustrates a perspective view of a singulated encapsulated device having exposed wettable leads or flanks in accordance with selected embodiments of the present invention.

After separating the encapsulated modules from one another into individual chip modules 510, 520, 530, 540 by cutting along the saw cut lines 502, each of the finally formed electrical contact leads (e.g., 112, 122, 132, 142) will include defined opposed top and bottom surfaces, an inner end, an outer end, and an opposed pair of side surfaces. Each defined outer end will have opposed top and bottom surfaces, where the bottom or interior surface (to which the wire bond is connected) is completely covered by encapsulant material, and where the opposed top or exterior surface includes a peripheral region in which is formed a recess which is sized and configured to accommodate the flow of reflow solder thereinto. This is illustrated in FIG. 7 which illustrates processing subsequent to FIG. 6 with a perspective view of a singulated encapsulated device 700 having exposed die flag portion 706 and wettable leads or flanks 702, 704 in accordance with selected embodiments of the present invention. As illustrated, each individual encapsulated device 700 has one or more electrical contact leads 702 having recessed regions 704 located at the periphery of the device 700, where each recessed region was formed by partially etching the lead 702 after encapsulation, followed by re-plating the partially etched region with a lead-free solder plating material, such as a high Tin, NiPd, NiPdAu, or the like. By virtue of singulating the chip modules after re-plating the partially etched leads, the sidewall surfaces of the chip module include a molding compound portion 202, one or more exposed metal lead frame portions 606, and one or more re-plate layer portions 704. The partially etched recess features at the periphery of each contact lead increases saw efficiency in the saw singulation process due to there being less material to cut in the saw streets. In addition, by reducing the cut line interface between the saw and each of the leads, the partially etched recess features reduce the amount of burring which typically occurs upon the leads as a result of the saw singulation process. Persons skilled in the art will appreciate that saw-generated burrs at the seating plan of each lead in the lead frame adversely affect solder mounting and joint reliability. By reducing burring, the feed rate of the saw along the saw streets can be increased, and there is less need for specialized, high cost saw blades, thereby increasing output and allowing for the use of lower cost saw blades.

Figure 8:
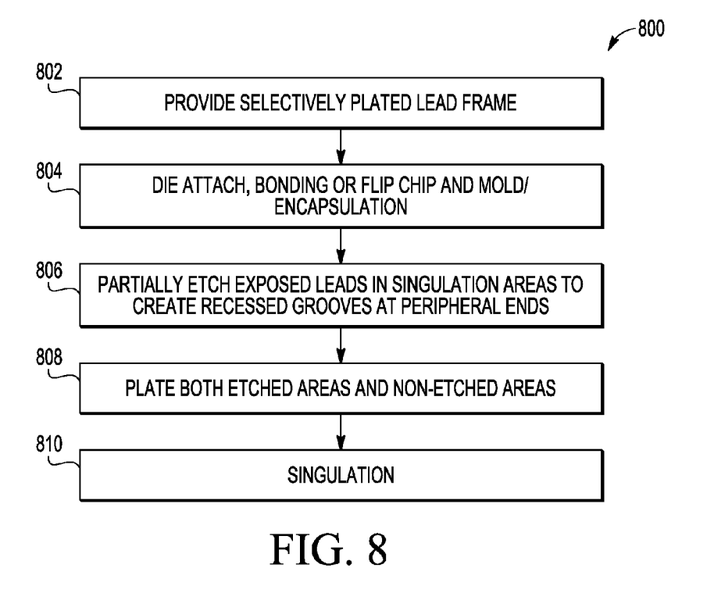
FIG. 8 illustrates an example flow chart depicting a process of fabricating a lead frame package with exposed pad and leads in accordance with selected embodiments of the present invention.

Turning now to FIG. 8, there is illustrated an example flow chart sequent 800 depicting a process of fabricating a lead frame package with exposed pad and leads in accordance with selected embodiments of the present invention. The process begins at step 802 when a selectively plated lead frame strip is provided. As will be appreciated, selectively plated lead frame strips can be obtained from lead frame suppliers such that the die pad and contact lead areas are plated with nickel palladium or other suitable material, while the intended saw streets are formed with exposed metal material, such as copper. Though not illustrated, it will be appreciated that the selectively plated lead frame strip may be provided to include recessed areas in the locations of the intended saw streets that have been plated with wettable material.

At step 804, the integrated circuit die are then mounted to the selectively plated lead frame strip using any desired surface mount or die attach technology. In addition, the die is electrically connected to the inner ends of the contact leads (e.g., 112, 122, 132, 142), such as by using a wirebonding flip-chip process, to connect the bond pads of the integrated circuit die to the internal electrical leads in the lead frame. In selected embodiments, the electrical bond wires are thermosonically bonded to the internal electrical leads and to the bond pads on the integrated circuit die. In addition, the mounted integrated circuit die is molded or encapsulated with an encapsulation packaging. The molding process may use a standard QFN molding process to encapsulate the integrated circuit die while retaining exposed die flags and leads which physically and electrically connect integrated circuit die to printed circuit boards. The molding material would not fill in the recesses of finished product due to the recesses yet to be formed after molding process. At this point, the surface of the encapsulated lead frame strip that is opposite the exposed die flags and leads may be affixed to a process carrier using an attachment device.

At step 806, a selective etch process is applied to partially etch the exposed (unplated) leads in the intended saw streets or singulation areas to form grooves or recesses at peripheral ends of leads. While any desired half etch process may be used, a suitable etch process is a copper etch process provided by the lead frame manufacturer or from any front end or back end fab, including but not limited to applying a chemical etch process in which persulfate salt (e.g., ammonium persulfate or sodium persulfate) is applied.

At step 808, the partially etched lead areas and non-etched areas are then re-plated with a solder wettable material to a predetermined thickness so that the exposed copper is covered while recesses remain in the lead areas, such as by depositing a layer of high Tin material to a predetermined thickness of approximately 2-15 microns, though other thicknesses may be used if sufficient material is formed to provide a wettable layer. At this stage, any desired re-plating or deposition process can be applied to the lead frame to re-plate the partially etched leads with a material that is wettable with solder. The thickness of the re-plated layer is controlled to assure that the re-plated grooves or recesses remain at peripheral ends of leads in the intended saw streets or singulation areas.

At step 810, the individual packaged devices are singulated with any desired singulation process, such as by applying a cutting mechanism, such as a saw, along the saw streets or singulation areas. The cutting mechanism may be selected and applied so that the width of the cutting gap is less than the width of the re-plated grooves or recesses. In this way, a portion of the re-plated groove or recess is still present at the peripheral ends of each contact lead. As a result, each packaged device is formed with recessed wettable lead flanks that provide increased solderable area, thereby increasing the overall solder joint strength and reliability while maintaining the quality and efficiency of sawn lead frame packaging processes. The recessed wettable lead flanks also allow the solder fillets to be visually inspected after the packaged device is soldered to the PCB.

By now, it should be appreciated that there has been provided herein a method for fabricating a recessed wettable lead end during package assembly. In the disclosed methodology, a selectively plated lead frame strip is provided that has opposing first and second sides. The lead frame strip may be provided as a copper lead frame strip that is formed to define a (plated) die pad for receiving an integrated circuit die, an unplated outer copper frame, and a plurality of separate (partially plated) copper contact leads that extend toward the die pad from an attached unplated outer frame, where each contact lead has a first plating coating formed on the second side in an interior region but not on an outer peripheral region. A package body is formed over the first side of the selectively plated lead frame strip to encapsulate an integrated circuit die attached to the die pad while leaving exposed the plurality of separate contact leads on the second side of the selectively plated lead frame strip. The package body may be formed by overmolding or transfer molding a composite material to cover each integrated circuit die attached to the die pad while leaving exposed the plurality of separate contact leads on the second surface of the selectively plated lead frame strip. Subsequently, a partially etch process is applied to the unplated outer frame and to the outer peripheral regions on the second surface of the plurality of separate contact leads that are not protected by the first plating coating. For example, the partial etch process may involve half-etching copper from the unplated outer frame and the outer peripheral regions on the second surface of the plurality of separate contact leads that are not protected by the first plating coating. The partial etch process forms a recessed lead end at the outer peripheral region of each contact lead. A second plating coating is subsequently formed on at least the recessed lead end of each contact lead to form a wettable recessed lead end at the outer peripheral region of each contact lead. In selected embodiments, the second plating coating is formed by applying a metal coating comprising nickel (e.g., nickel palladium) to cover the recessed lead end of each contact lead and a partially etched portion of the unplated outer frame. After forming the second plating coating, the package body and the lead frame strip are cut to leave each contact lead with a portion of the wettable recessed lead end at the outer peripheral region of each contact lead, where the cutting may be performed by performing a saw cut or laser cut.

In another form, there is provided a method of making a quad flat no-lead chip package and an apparatus formed thereby. In the disclosed manufacturing method, an array of copper lead frames is provided where the frames have opposing first and second sides and are integrally connected together in a matrix. Each lead frame includes an unplated copper outer frame defining a central opening, a plated copper die pad disposed within the central opening, and a plurality of partially plated copper leads attached to the outer frame and extending toward the die pad. Each of the partially plated copper leads has a first unplated portion immediately adjacent to the unplated outer copper frame, thereby defining an exposed lead frame strip region that includes the unplated outer copper frame and the first unplated portion of each partially plated copper lead. Thus, a plating layer is selectively formed on the first side of the lead frame strip to leave an exposed lead frame strip region on the outer frame and a first portion of each lead immediately adjacent to the outer frame. A plurality of integrated circuit die are connected to the array of lead frames by affixing an integrated circuit die to each die flag and electrically coupling each integrated circuit die to a corresponding plurality of leads associated with the attached integrated circuit die. After connecting integrated circuit die to the lead frames, the die are encapsulated with a molding compound formed on the second side of the array of lead frames (e.g., by overmolding or transfer molding a composite material) which leaves an exposed lead frame strip region on the first side of the array of lead frames. The exposed lead frame strip region is partially etched to form a recessed lead frame strip region on the first side of the array of lead frames, such as by half-etching copper from the exposed lead frame strip region on the first side of the array of lead frames. The recessed lead frame strip region is then plated with a wettable material to form a plated recessed lead frame strip region, such as by applying a metal coating comprising nickel to plate the recessed lead frame strip region. By cutting through the molding compound and the array of lead frames in the plated recessed lead frame strip region with a singulation process (e.g., performing a saw cut or laser cut), the leads are separated and formed so that each lead includes a portion of the plated recessed lead frame strip region at an outer peripheral region.

In yet another form, there is provided a method for packaging a semiconductor chip and an apparatus formed thereby. In the disclosed manufacturing method, a lead frame strip is provided that has a package body formed on a first side of the lead frame strip to encapsulate a semiconductor chip. The packaged lead frame strip may be formed by attaching a semiconductor chip to a die flag on the lead frame strip, electrically coupling the semiconductor chip to a plurality of leads, and forming a package body over the lead frame strip to encapsulate the semiconductor chip and the lead frame strip. As formed, the lead frame strip includes an outer frame member and plurality of leads connected to the outer frame member and extending inwardly therefrom on a second side of the lead frame strip. On at least the second side of the lead frame strip, a metal coating is formed on a first interior portion of each lead but not on an outer peripheral portion of each lead. Subsequently, any areas on the second side of the lead frame strip without protection of the metal coating are partially etched to form a recess in at least the outer peripheral portion of each lead. This may be done by half etching the outer frame member and the outer peripheral portion of each lead not covered with the metal coating on the second side of the lead frame strip. In the recess, a first metal coating (e.g., a metal coating comprising nickel) is deposited or plated to form a plated recess in at least the outer peripheral portion of each lead. Finally a singulation process, such as performing a saw cut or laser cut, is applied to cut along the outer frame member to separate the plurality of leads such that each separated lead includes a portion of the plated recess at a peripheral end exposed by said singulation process.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a recessed wettable lead end during package assembly, comprising:
   providing a selectively plated lead frame strip having opposing first and second sides, the selectively plated lead frame strip comprising a die pad for receiving an integrated circuit die and a plurality of contact leads extending toward the die pad from an attached frame, where each contact lead has a first plating coating formed on the second side in a first region but not on an second peripheral region;
   forming a package body over the first side of the selectively plated lead frame strip to encapsulate an integrated circuit die attached to the die pad while leaving exposed the plurality of contact leads on the second side of the selectively plated lead frame strip;
   partially etching the second peripheral regions on the second surface of the plurality of contact leads that are not protected by the first plating coating to form a recessed lead end at the second peripheral region of each contact lead; and
   forming a second plating coating on at least the recessed lead end of each contact lead to form a wettable recessed lead end at the second peripheral region of each contact lead.

2. The method of claim 1, where providing the selectively plated lead frame strip comprises providing a copper lead frame strip formed to define a plated die pad, a plurality of partially plated separate copper contact leads, and an unplated copper frame.

3. The method of claim 1, where forming the package body comprises overmolding or transfer molding a composite material to cover each integrated circuit die attached to the die pad while leaving exposed the plurality of separate contact leads on the second surface of the selectively plated lead frame strip.

4. The method of claim 1, where partially etching the frame and the second peripheral regions comprises half-etching copper from the frame and the second peripheral regions on the second surface of the plurality of separate contact leads that are not protected by the first plating coating.

5. The method of claim 1, where forming a second plating coating comprises applying a metal coating comprising tin or nickel to cover the recessed lead end of each contact lead and a partially etched portion of the frame.

6. The method of claim 1, further comprising, after forming the second plating coating, cutting through the package body and the lead frame strip to leave each contact lead with a portion of the wettable recessed lead end at the second peripheral region of each contact lead.

7. The method of claim 6, where cutting through the package body and the lead frame strip comprises performing a saw cut or laser cut or other singulation process.

8. The method of claim 1, where partially etching the frame and the second peripheral forms the recessed lead end at the second peripheral region of each contact lead having an etch depth of approximately 50 microns.

9. A method of making a quad flat no-lead chip package comprising:
   providing an array of lead frames integrally connected together and having opposing first and second sides, each lead frame comprising an outer frame, a die pad disposed within the outer frame, and a plurality of leads attached to the outer frame and extending toward the die pad, where a plating layer is selectively formed on the first side of the lead frame strip to leave an exposed lead frame strip region on the outer frame and at least a first portion of each lead immediately adjacent to the outer frame;
   connecting a plurality of integrated circuit die to the array of lead frames so that, in each lead frame, an integrated circuit die is affixed to the die flag;
   encapsulating the plurality of integrated circuit die with a molding compound formed on the second side of the array of lead frames while leaving exposed the exposed lead frame strip region on the first side of the array of lead frames;
   partially etching the exposed lead frame strip region to form a recessed lead frame strip region on the first side of the array of lead frames;

plating the recessed lead frame strip region with a wettable material to form a plated recessed lead frame strip region; and cutting through the molding compound and the array of lead frames in the plated recessed lead frame strip region to leave each lead with a portion of the plated recessed lead frame strip region at an outer peripheral region.

10. The method of claim 9, where connecting the plurality of integrated circuit die to the array of lead frames comprises:

attaching an integrated circuit die to each die pad of the array of lead frames; and electrically coupling each integrated circuit die to a corresponding plurality of leads associated with the attached integrated circuit die.

11. The method of claim 9, where providing the array of lead frames comprises providing an array of copper lead frames with each copper lead frame comprising an unplated copper outer frame, a plated copper die pad disposed within the unplated copper outer frame, and a plurality of partially plated copper leads attached to the unplated copper outer frame, where each of the partially plated copper leads has a first unplated portion immediately adjacent to the unplated copper outer frame such that the exposed lead frame strip region is defined by the unplated copper outer frame and the first unplated portion of each partially plated copper lead.

12. The method of claim 9, where partially etching the exposed lead frame strip region comprises applying a persulfate salt etch chemistry that is selective to the plating layer to form the recessed lead frame strip region on the first side of the array of lead frames.

13. The method of claim 9, where partially etching the exposed lead frame strip region comprises half-etching copper from the exposed lead frame strip region on the first side of the array of lead frames.

14. The method of claim 9, where plating the recessed lead frame strip region comprises applying a metal coating comprising tin or nickel to plate the recessed lead frame strip region.

15. The method of claim 9, where cutting through the molding compound and the array of lead frames comprises performing a saw cut or laser cut or other singulation process.

16. A method for packaging a semiconductor chip comprising:

providing a lead frame strip having a package body formed on a first side of the lead frame strip, where the lead frame strip comprises a plurality of outer frame members, each of which comprises a plurality of leads connected to the outer frame member and extending inwardly therefrom on a second side of the lead frame strip, with a metal coating formed on a first portion of each lead but not on an second peripheral portion of each lead;

partially etching areas on the second side of the lead frame strip without protection of the metal coating such that a recess is formed in at least the second peripheral portion of each lead;

forming a first metal coating in the recess to form a plated recess in at least the second peripheral portion of each lead; and cutting along each outer frame member to separate the plurality of leads such that each separated lead includes a portion of the plated recess at a peripheral end exposed by said cutting.

17. The method of claim 16, where providing a lead frame strip comprises:

providing a lead frame strip comprising a plurality of outer frame members, each of which comprises a plurality of leads connected to the outer frame member and extending inwardly on a second side of the lead frame strip, forming a metal coating on a first portion of each lead but not on an second peripheral portion of each lead; and forming a package body on the first side of the lead frame strip.

18. The method of claim 16, where partially etching areas on the second side of the lead frame strip comprises half etching each outer frame member and second peripheral portion of each lead not covered with the metal coating on the second side of the lead frame strip.

19. The method of claim 16, where forming the first metal coating comprises plating the recess with a metal coating comprising tin or nickel.

20. The method of claim 16, where cutting along the outer frame member comprises performing a saw cut or laser cut or other singulation process.

* * * * *